United States Patent
Lisitsky et al.

(10) Patent No.: US 6,485,562 B1
(45) Date of Patent: Nov. 26, 2002

(54) PRODUCTION OF MATERIAL WITH IMPROVED INFRARED TRANSMISSION

(75) Inventors: Igor S. Lisitsky, Moscow (RU); Valeri F. Golovanov, Moscow (RU); Galina V. Poliakova, Moscow (RU)

(73) Assignee: CeramOptec Industries, Inc., East Longmeadow, MA (US)

( * ) Notice: Subject to any disclaimer, the term of this patent is extended or adjusted under 35 U.S.C. 154(b) by 0 days.

(21) Appl. No.: 09/931,263

(22) Filed: Aug. 16, 2001

(51) Int. Cl.[7] .............................................. C30B 25/02
(52) U.S. Cl. ............................................................ 117/3
(58) Field of Search .................................. 117/3, 81, 83

(56) References Cited

U.S. PATENT DOCUMENTS

| | | | |
|---|---|---|---|
| 4,253,731 A | | 3/1981 | Anderson et al. |
| 4,504,298 A | * | 3/1985 | Yokota et al. ................... 65/3 |
| 4,532,000 A | | 7/1985 | Harrington et al. |
| 4,583,821 A | | 4/1986 | Murakami et al. |
| 4,678,274 A | | 7/1987 | Fuller |
| 4,721,360 A | | 1/1988 | Murakami et al. |
| 4,741,752 A | | 5/1988 | France et al. |
| 4,955,689 A | | 9/1990 | Fuller et al. |
| 5,182,790 A | * | 1/1993 | Kayashima et al. ........ 385/141 |
| 5,186,870 A | | 2/1993 | Fuller et al. |
| 5,575,959 A | | 11/1996 | Harris et al. |
| 5,575,960 A | | 11/1996 | Kayashima et al. |
| 6,016,197 A | * | 1/2000 | Knivoshlykov ............. 356/345 |

OTHER PUBLICATIONS

Hass M., Davisson J.W., Rosenstock H.B., Applied Optics, 1975, pp. 1128–1130, vol. 14. N.5, USA.

Dianov E.M., Masychev V.I., Plotnichenko V.G., Sysoev V.K.; Kvanlovaya Elektron,Jun. 1980, pp.1341–1343v.7 Moscow.

Hass M., Davisson J.W., Boyer L.L., J. Applied Phy 1974, pp.3959–3964, v45 USA.

* cited by examiner

Primary Examiner—Felisa Hiteshew
(74) Attorney, Agent, or Firm—Bolesh J Skutnik; BJ Associates

(57) ABSTRACT

The invention relates to the field of producing material that has a low absorbance in the 5 to 15 micron wavelength range. The process is particularly useful for producing single crystals of silver halides for use in manufacturing fiber optic light guides with low optic loss in the medium IR range. This invention covers a totality of process steps and a sequential order in which they are carried out. The process of synthesizing this low IR absorbing material requires careful preparation of raw materials into suitable starting materials, followed by mixing specific ratios of the starting materials. A specific melting process then further purifies the mix. Once this initial purification process is completed, a specialized second purification process is performed on the material from the first process. This second purification process yields the proper material for crystallization via the Stockbarger-Bridgeman method. The final product becomes the starting material for an optical fiber or other optical component, like lenses or windows, with improved IR transmission.

15 Claims, 2 Drawing Sheets

PRODUCTION OF MATERIAL WITH IMPROVED INFRARED TRANSMISSION

BACKGROUND OF THE INVENTION

1. Field of the Invention

This invention relates to the production of materials can be used in the middle infrared (IR) range for laser technology and fiber optics.

2. Invention Disclosure Statement

The current state of the art in the production of materials with low absorbency in the IR range has focused on the process for making an improved end product rather than improving the infrared transmission of the starting material.

U.S. Pat. No. 5,186,870 describes a method for fabricating a fiber capable of transmitting IR light. This fiber is constructed of a silver halide compound that is extruded to form a single crystalline structure for a core and a polycrystalline structure for the cladding. This patent refers to the process of manufacturing the fiber. This patent does not reveal how to produce the actual silver halide composite so as to reduce the absorption of IR radiation.

U.S. Pat. No. 4,955,689 describes the actual fiber produced by the process in U.S. Pat. No. 5,186,870. The formulation used was a halide compound. This patent does not reveal how to produce the actual halide composite so as to reduce the absorption of IR radiation.

U.S. Pat. No. 5,575,960 describes a method of manufacturing an unclad fiber capable of transmitting IR. The process creates a fiber that is more durable and more evenly manufactured than conventional methods. This process does not reveal how to create a silver halide composite that is more transmitting and less absorbing of IR radiation than convention methods.

U.S. Pat. No. 5,575,959 describes a process for making an infrared window. This invention uses a zinc sulfide material with a gallium sulfide additive to produce a material that is highly transmitting to IR. This invention is limited to the making of IR windows using zinc sulfide. This patent also does not reveal how to improve the IR transmission of IR material.

U.S. Pat. No. 4,532,000 describes a method for making a crystal fiber through the melting of two polycrystalline fibers. This patent concentrates on the ability to make a fiber that is capable of IR transmission. This invention does not reveal how to make a fiber that has an improved IR transmission or how to improve the materials of the fibers.

U.S. Pat. No. 4,253,731 describes a method for making a silver chloride fiber with a silver bromide cladding capable of transmitting IR. This invention concentrates primarily on the fabrication of the fiber and not the fiber material. This invention does not reveal how to improve the transmittance of the fiber.

U.S. Pat. No. 4,678,274 describes an invention that improves the extrusion process for drawing fibers by integrating a rapid cooling mechanism. This cooling mechanism at the point of extrusion helps reduce the grain size of the fiber. A reduced grain size will reduce the scattering inside the fiber and therefore increase the transmission of the fiber. This invention, however, does not reveal how to increase the transmission of IR in the starting material prior to the drawing of the fiber.

U.S. Pat. No. 4,583,821 and U.S. Pat. No. 4,721,360 describe inventions that do improve the starting material used in IR transmission. The improvements, however, are only for the tensile and yield strength of the material not the transmission aspect of the material.

U.S. Pat No. 4,741,752 describes a process for treating a halide glass composition to improve infrared transmission at the wavelength of 2.7 microns by contacting a melt of the composition with dry oxygen without exposing the melt to ambient air. The improvement converts Fe (II) to Fe (III) and thereby reduces loss at the transmission wavelength attributable to Fe (II). The invention does not improve infrared transmission at 10.6 microns, which is the working wavelength of the $CO_2$ laser.

It would be useful to have a process that can synthesize a material that allows greater transmission of IR in the 5 to 15 micron wavelength range than current processes allow.

BRIEF SUMMARY OF THE INVENTION

It is an object of the present invention to describe a process for synthesizing single crystals of material that has a low absorbance in the 5 to 15 micron wavelength range.

It is another object of the present invention to provide single crystals of silver halides that have reduced absorbance in the 5 to 15 micron wavelength range.

It is a further object of the present invention to provide single crystals of silver halides that have improved transmittance at 10.6 microns, the working wavelength of the $CO_2$ laser.

It is yet another object of the present invention to produce a fiber optic light guide for operation over medium IR wavelength range with low optic loss.

Briefly stated the present invention provides a method of synthesizing a material that has a low absorbance in the 5 to 15 micron wavelength range. The method is particularly useful for producing single crystals of silver halides for use in manufacturing fiber optic light guides with low optic loss in the medium IR range. This invention covers a totality of process steps and a sequential order in which they are carried out. The process of synthesizing this low IR absorbing material requires careful preparation of raw materials into suitable starting materials, followed by mixing specific ratios of the starting materials. A specific melting process then further purifies the mix. Once this initial purification process is completed, a specialized second purification process is performed on the material from the first process. This second purification process yields the proper material for crystallization via the Stockbarger-Bridgeman method. The final product becomes the starting material for an optical fiber or other optical component, like lenses or windows, with improved IR transmission.

The above and other objects, features and advantages of the present invention will become apparent from the following description read in conjunction with the accompanying drawings

DETAILED DESCRIPTION OF PREFERRED EMBODIMENTS

Figure 1:
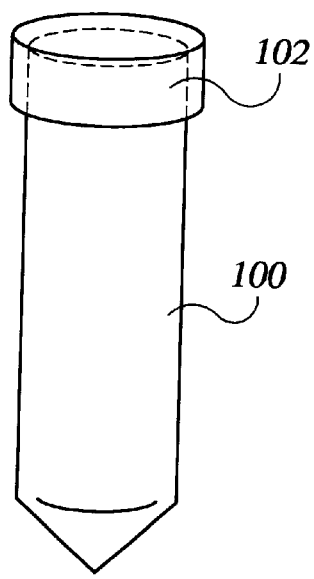
FIG. 1 is a view of an ampoule having a lid

The present invention is process for producing single silver halide crystals, which can be used for manufacturing fiber optic light guides for operation over a medium IR range (5–15 microns) with low optic losses. First and second silver halides are prepared in the form of their individual salts by precipitating the salts from an aqueous solution. Typically, a solution of silver nitrate is prepared and an alkaline halide added to produce its corresponding silver halide. Silver chloride can be prepared by adding potassium chloride or hydrogen chloride to the silver nitrate solution. Silver bromide can be prepared by adding potassium bromide or hydrogen bromide to the silver nitrate solution. The individual salts are mixed in a predetermined ratio in a melt ampoule and heated in a two-zone furnace to form a melt of the solid solution of silver halides. Mixing may be performed in a number of ways, which may include convection stirring or rotational mixing. Mixing is performed under a selected atmosphere, which generally includes air or a halogenating vapor. The solid solution is purified by an oriented crystallization, which produces an ingot of solid solution having a contaminant-loaded end. The contaminant-loaded end is cut off. The amount removed depends on the amount of contaminant and the efficiency of the exclusion process. The purified ingot of solid solution is then successively melted and filtered through a capillary first in the air and next in vacuum, followed by subjecting the melt to an oriented crystallization. The contaminant-loaded end is again cut off of the resultant purified ingot. The step of melting and capillary filtering may be repeated several times to achieve a refined ingot of desired purity. Single crystals of silver halide are then grown by the Stockbarger-Bridgeman method in an atmosphere of halogenating agent vapors. These generally include chloride, bromine and iodine vapor.

The present invention is further illustrated by the following examples, but is not limited thereby.

EXAMPLE 1

A solution of silver nitrate was prepared by dissolving 99.99%-pure silver metal in nitric acid. Potassium chloride was added to a portion of the silver nitrate solution to precipitate silver chloride. Potassium bromide was added to a second portion of the silver nitrate solution to precipitate silver bromide. The precipitates were filtered from solution and dried to form precursor salts. The precursor salts with a weight of 150 g were mixed in a weight ratio of 50% AgCl: 50% AgBr (denoted as KPC-11) in a 20–30 mm diameter Ampoule 100 made of a heat-resistant glass. Ampoule 100 was closed with lid 102 and placed into the upper high temperature zone 402 of two-zone vertical furnace 400. The upper high temperature zone 402 was kept at a temperature of 450–550 C., while that of low temperature zone 404 was kept at 200–300 C. The salt was fused and maintained for 2–3 hours to allow the melt to convectively stir. Thereafter, ampoule 100 was allowed to sink into the low temperature zone 404 at a rate of 4 mm/h to effect an oriented crystallization of the melt. The upper contaminated end loaded with forced-out impurities was cut off the purified ingot of KPC-11 solid solution leaving a purified portion.

Figure 2:
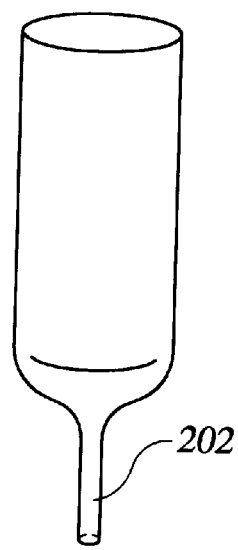
FIG. 2 is a view of an ampoule having a capillary base
Figure 3:
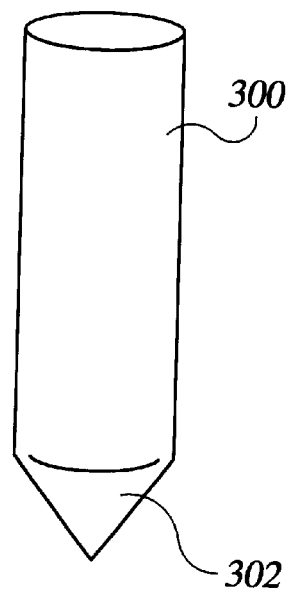
FIG. 3 is a view of an ampoule having a conical base
Figure 4:
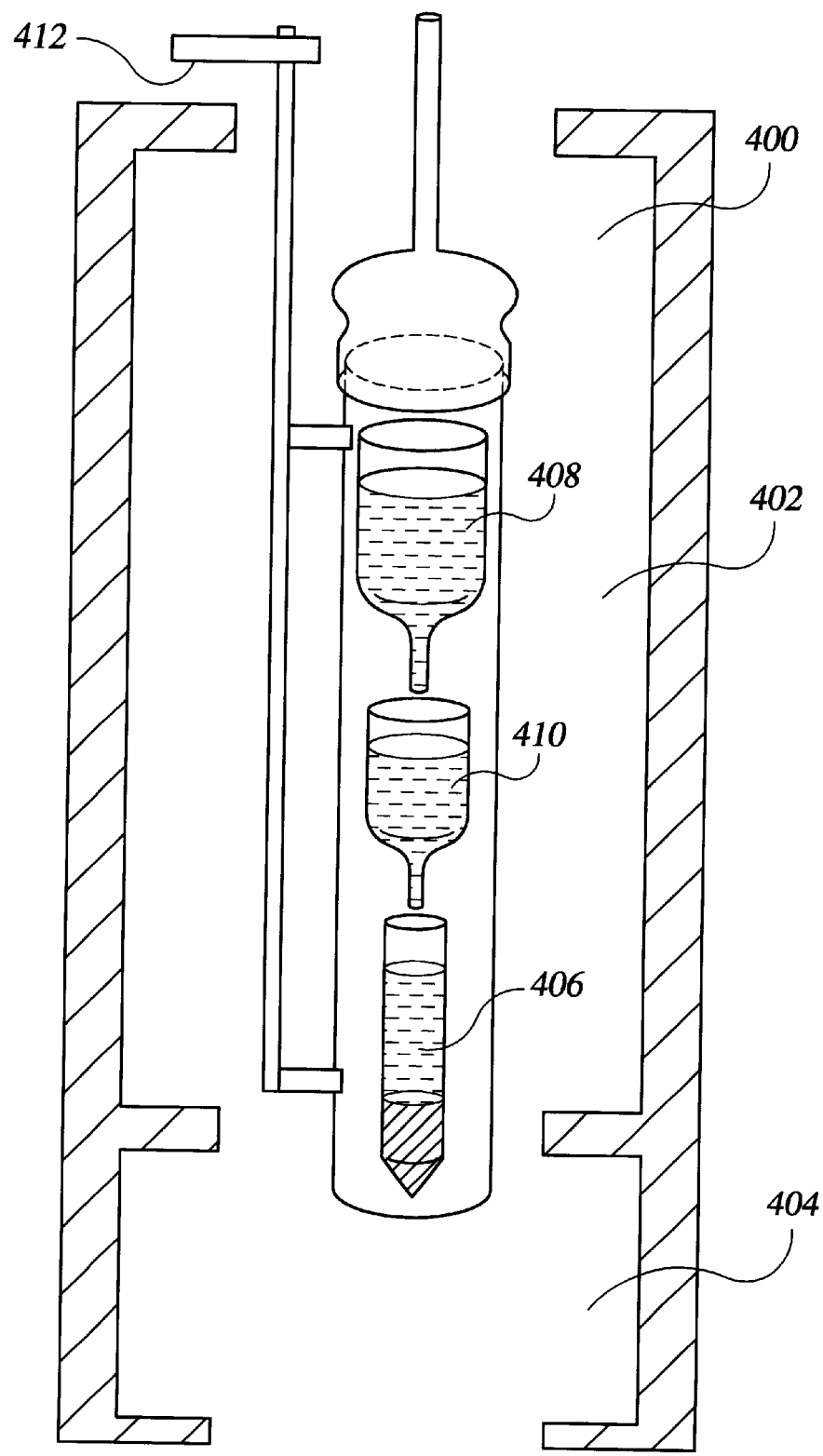
FIG. 4 is a cross-sectional view of a two-zone vertical furnace with capillary base ampoules and conical base ampoule in series.

To carry out further purification of the solid solution as part of an integrated process, ampoule 406 was placed into the upper high temperature zone 402 of two-zone vertical furnace 400. This ampoule was made of a heat-resistant glass and had a diameter of 20 mm and a length of 150 mm. Ampoule 406 had a conically shaped bottom 302 (see FIG. 3). Upper capillary ampoule 408 and lower capillary ampoule 410 both terminated below by a thin open capillary 202 (see FIG. 2) were placed in series over conical based ampoule 406.

The purified portion of the KPC-11 ingot produced in the previous oriented crystallization step was subjected to melting in air in upper capillary ampoule 408. The melt was filtered first into lower capillary ampoule 410, from which the melt was filtered in vacuum into conical based ampoule 406. Finally, the melt was subjected to an oriented crystallization in the air by lowering conical based ampoule 406 into low temperature zone 404 at a rate of 3 mm/h.

The contaminated end containing forced-out impurities was again cut off the resulting purified ingot. The purified portion of the ingot weighing about 100 g was charged into ampoule 300 having a 18 mm diameter and 250 mm length for final crystal growth. The ampoule was evacuated to a residual pressure of $5 \times 10^{-3}$ mm Hg, whereupon the volume thus liberated was filled with 50 mg of bromine vapors. The ampoule was then sealed and placed into the upper zone 402 of furnace 400 for heating to melt down the silver halide. The temperature of upper zone 402 was then raised by 30–50 C. and kept at this level of 2–3 hours to homogenize the melt. Final crystal growth was accomplished by moving ampoule 300 containing the melt into the lower zone 404 of furnace 400 having a temperature of 200–250 C. at a travelling rate of 1.5 mm/h. Once crystallization of the entire melt was over, drive 412 for moving ampoule 300 was switched off, while the crystal grown was subjected to annealing by cooling lower zone 404 of furnace 400 at a rate of 40 C./h down to room temperature.

The measurement of the low absorption factors of the silver halide crystals was accomplished by widely used calorimetric methods (described for example by Hass M., Davisson J. W., Rosenstock H. B., Applied Optics, vol.14, N.5, 1975.pp. 1128–1130; Dianov E. M., Masychev V. I., Plotnichenko V. G., Sysoev V. K., Kvanlovaya Elektron (Moscow). Jun. 7, 1980, pp.1341–1343; Hass M., Davisson J. W., Boyer L. L., J. Appl. Phys., 1974, v.45, p.3959) . For the current invention, the temperature rise of the silver halide crystals heated by the absorption of $CO_2$ laser radiation was measured at the 10.6 micron wavelength. The absorption factor of the material was determined from the slope of the resulting temperature-time curve.

The laser radiation absorption factor as measured by the calorimetric method at a wavelength of 10.6 microns, was equal to $2.0 \times 10^{-4}$ cm$^{-1}$ for this grown crystal. The latter was used for making the sheathing of a sheathed-type light guide. Optic losses in the ready-made light guide did not exceed 600 dB/km.

For comparison, the absorption factor was measured in crystal grown from salts manufactured by standard method without adding bromine. The absorption factor of $CO_2$ laser radiation at a wavelength of 10.6 microns in crystal grown by such standard method was in the range of $5.0$ to $50 \times 10^{-4}$ cm$^{-1}$. Optic losses in light guides produced from such crystals were in the range of 600 to 1000 dB/km.

EXAMPLE 2

A solution of silver nitrate was prepared by dissolving 99.99%-pure silver metal in nitric acid. Potassium chloride was added to a portion of the silver nitrate solution to precipitate silver chloride. Potassium bromide was added to a second portion of the silver nitrate solution to precipitate silver bromide. The precipitates were filtered from solution and dried to form precursor salts. The precursor salts with a weight of about 200 g were mixed in a weight ratio of 25% AgCl: 75% AgBr (denoted as KPC-13) in a 20–30 mm diameter Ampoule 100 made of a heat-resistant glass. Ampoule 100 was evacuated to a residual pressure of $5 \times 10^{-3}$ mm Hg and the liberated volume was filled with 150 mg of bromine vapor and sealed. Ampoule 100 was placed into the upper high temperature zone 402 of two-zone vertical furnace 400. The upper high temperature zone 402 was kept at a temperature of 450–550 C., while that of low temperature zone 404 was kept at 200–300 C. The salt mixture was fused into a melt. To facilitate stirring of the melt, two-zone vertical furnace 400 with ampoule 100 therein was inclined at an angle of 80–85 degrees in relation to the vertical, and ampoule 100 was caused to revolve about its longitudinal axis at a rate of 60 rpm. After 2–3 hours, the rotary movement was discontinued and two-zone vertical furnace 400 was moved to its original vertical position. The ampoule 100 was then moved into low temperature zone 404 of two-zone vertical furnace 400 at a downward rate of 4 mm/h to effect an oriented crystallization. The contaminated end loaded with forced out impurities was cut off the thus grown ingot of KPC-13 solid solution, leaving a purified portion.

To proceed with further purification of the solid solution as part of an integrated process, ampoule 406 was placed into upper high temperature zone 402 of two-zone vertical furnace 400. This ampoule was made of a heat-resistant glass and had a diameter of 20 mm and a length of 200 mm. Ampoule 406 had a conically shaped bottom 302 (see FIG. 3). Upper capillary ampoule 408 and lower capillary ampoule 410 both terminated below by a thin open capillary 202 (see FIG. 2) were placed in series over conical based ampoule 406.

Upper capillary ampoule 408 was charged with the purified portion of the KPC-13 solid solution ingot produced in the previous oriented crystallization step. This purified portion was melted in air in upper capillary ampoule 408. The melt was filtered first into lower capillary ampoule 410, from which the melt was next filtered into conical ampoule 406. Finally, the melt was subjected to an oriented crystallization in the air by lowering conical based ampoule 406 into low temperature zone 404 at a rate of 3 mm/h The contaminated end containing forced out impurities was again cut off the resulting purified ingot. The purified portion of the ingot weighing about 100 g was charged into ampoule 300 having a diameter of 18 mm and a length of 250 mm for final crystal growth. Ampoule 300 was evacuated to a residual pressure of $5 \times 10^{-3}$ mm Hg, whereupon the volume thus liberated was filled with 10 mg of iodine vapors. Ampoule 300 was then sealed and placed into the upper temperature zone 402 of furnace 400 to melt down the silver halide. The temperature was then raised by 30–50 C. and kept at this level of 2–3 hours to homogenize the melt. Final crystal growth was accomplished by moving ampoule 300 containing the melt into lower zone 404 of furnace 400 having a temperature of 200–250 C. at a traveling rate of 1.5 mm/h. Once crystallization of the entire melt was over, drive 412 for moving ampoule 300 was switched off, while the crystal grown was subjected to annealing by cooling lower zone 404 of furnace 400 at a rate of 40 C./h down to room temperature.

The laser radiation absorption factor of the crystal thus grown, as measured by the calorimetric method at a wavelength of 10.6 microns was equal to $2.5 \times 10^{-4}$ cm$^{-1}$. Fiber optic light guides manufactured from the crystal in question had optic loss of less than 500 dB/km.

For comparison, the absorption factor was measured in crystal grown from salts manufactured by standard method without adding iodine. The absorption factor of $CO_2$ laser radiation at a wavelength of 10.6 microns in crystal grown by such standard method was in the range of 5.0 to $50 \times 10^{-4}$ cm$^{-1}$. Optic losses in light guide manufactured from such crystal were in the range of 600 to 100 dB/km.

It should be understood that by using different silver halides or by changing processing conditions, such as time, temperature, selected atmosphere, or mixing method, that results may differ from those obtained in these examples.

Having described preferred embodiments of the invention with reference to the accompanying drawings, it is to be understood that the invention is not limited to the precise embodiments, and that various changes and modifications may be effected therein by skilled in the art without departing from the scope or spirit of the invention as defined in the appended claims.

What is claimed is:

1. A process for producing single silver halide crystals having improved IR transmission over a medium IR range (5–15 microns) comprising the steps of:

(a) preparing a first silver halide and a second silver halide in the form of their individual precursor salts by precipitating said silver halides from an aqueous solution;

(b) combining said first silver halide and said second silver halide precursor salts in a predetermined ratio to form a mix;

(c) placing said mix in a mixing ampoule made of a heat-resistant glass and having a longitudinal axis;

(d) filling said mixing ampoule with a selected atmosphere;

(e) closing said mixing ampoule and placing said ampoule into an upper high temperature zone of a two-zone vertical furnace at a temperature where said salt mixture is fused into a melt of a solid solution of silver halide, and maintained for a sufficient time to allow said melt to stir;

(f) allowing said mixing ampoule to sink from said upper zone to a lower zone of said furnace at a rate to effect an oriented crystallization of said melt;

(g) cutting off a contaminated end loaded with forced-out impurities from a thus-grown ingot of solid solution, leaving a purified portion;

(h) further purifying said ingot of solid solution by placing an ampoule made of a heat-resistant glass having a conical shaped bottom into said upper zone of said furnace, then placing an upper and a lower capillary ampoule which terminate below by a thin open capillary, sequentially above said ampoule having said conically shaped bottom;

(i) placing said purified portion of said ingot of solid solution into said first capillary ampoule where said ingot is subjected to melting in air, filtering said melt from the upper capillary ampoule into said lower capillary ampoule, from which said melt is filtered in vacuum into said ampoule with said conically shaped bottom;

(j) subjecting said melt to an oriented crystallization in the air by moving said ampoule into said lower zone of said furnace at a downward rate sufficient to effect an oriented crystallization;

(k) cutting off a contaminated end of a resulting ingot, creating a purified portion;

(l) repeating steps (h) through (k) until a desired purity is achieved;

(m) placing said purified portion into an ampoule for final crystal growth and evacuating said ampoule to a residual pressure, then filling a volume thus-liberated with a halogenating vapor;

(n) sealing said ampoule and placing said ampoule into said upper zone of said furnace to melt down silver halide;

(o) raising the temperature of said upper zone by 30–50 C. and maintaining at this level for a selected time to homogenize said silver halide melt;

(p) moving said ampoule containing said silver halide melt into said lower zone of said furnace at a travelling rate sufficient for final crystallization to occur, until crystallization of said silver halide melt is complete; and (q) annealing a thus grown silver halide crystal by cooling said crystal in said lower zone of said furnace at a selected rate down to room temperature.

2. The process of claim 1 wherein said first silver halide and said second silver halide are selected from the group consisting of AgCl, AgBr and AgI.

3. The process of claim 1 wherein said first silver halide is AgCl and said second silver halide is AgBr.

4. The process of claim 1 wherein said mixing atmosphere is selected from the group consisting of air, chlorine, bromine and iodine vapor.

5. The process of claim 1 wherein said first silver halide and said second silver halide are mixed in a weight ratio of 1:1.

6. The process of claim 1 wherein said first silver halide and said second silver halide are mixed in a weight ratio of 1:3.

7. The process of claim 1 wherein said upper high temperature zone of said furnace has a temperature of about 450–550 C.

8. The process of claim 1 wherein said lower temperature zone of said furnace has a temperature of about 200–300 C.

9. The process of claim 1 wherein said mixing ampoule is closed with a lid and said melt is convectively stirred.

10. The process of claim 1 wherein said mixing ampoule is closed by sealing said ampoule and said melt is stirred by inclining said furnace with said mixing ampoule therein at an angle of about 80–85 degrees in relation to the vertical, and causing said ampoule to revolve about its longitudinal axis at a rate of about 60 rpm.

11. The process of claim 1 wherein said selected time to homogenize said silver halide melt is 2–3 hours.

12. The process of claim 1 wherein said downward rate sufficient to effect an oriented crystallization is about 4 mm/h.

13. The process of claim 1 wherein said halogenating vapor is selected from the group consisting of chlorine, bromine and iodine.

14. The process of claim 1 wherein said traveling rate sufficient for final crystallization to occur is about 1.5 mm/h.

15. The process of claim 1 wherein annealing occurs at a selected rate of about 40 C. per hour.

* * * * *